(12) United States Patent
Chu

(10) Patent No.: US 9,214,210 B2
(45) Date of Patent: Dec. 15, 2015

(54) SEMICONDUCTOR MEMORY APPARATUS, BLOCK DECODER THEREFOR, AND DECODING METHOD THEREOF

(75) Inventor: Gyo Soo Chu, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 363 days.

(21) Appl. No.: 13/604,513

(22) Filed: Sep. 5, 2012

(65) Prior Publication Data

US 2013/0215702 A1    Aug. 22, 2013

(30) Foreign Application Priority Data

Feb. 20, 2012    (KR) ........................ 10-2012-0017104

(51) Int. Cl.
*G11C 8/12*    (2006.01)

(52) U.S. Cl.
CPC ........................................ *G11C 8/12* (2013.01)

(58) Field of Classification Search
CPC .................................... G11C 8/10; G11C 8/12
USPC .............. 365/185.11, 185.23, 230.03, 230.06
See application file for complete search history.

(56) References Cited

U.S. PATENT DOCUMENTS

| 6,072,721 | A  | * | 6/2000 | Arase | ...................... | G11C 16/10 365/185.11 |
| 2005/0013166 | A1 | * | 1/2005 | Chen | ...................... | G11C 16/12 365/185.03 |
| 2007/0121388 | A1 | * | 5/2007 | Lee | ........................... | 365/185.29 |
| 2007/0263457 | A1 | * | 11/2007 | Park | ....................... | G11C 16/16 365/185.33 |
| 2008/0266956 | A1 | * | 10/2008 | Byeon | ...................... | G11C 8/10 365/185.09 |
| 2010/0182835 | A1 | * | 7/2010 | Chung | ..................... | 365/185.11 |

FOREIGN PATENT DOCUMENTS

KR    10-0428807    4/2004

* cited by examiner

*Primary Examiner* — Douglas King
(74) *Attorney, Agent, or Firm* — William Park & Associates Ltd.

(57) ABSTRACT

A block decoder including a first selection unit configured to receive a block address signal and output a block select signal to any one of a plurality of blocks, and a second selection unit configured to receive a high voltage and control a potential level of the block select signal according to the block address signal.

12 Claims, 7 Drawing Sheets

SEMICONDUCTOR MEMORY APPARATUS, BLOCK DECODER THEREFOR, AND DECODING METHOD THEREOF

CROSS-REFERENCES TO RELATED APPLICATION

The present application claims priority under 35 U.S.C. §119(a) to Korean application number 10-2012-0017104, filed on Feb. 20, 2012, in the Korean Intellectual Property Office, which is incorporated herein by reference in its entirety.

BACKGROUND

1. Technical Field

The present invention generally relates to a semiconductor apparatus, and more particularly, to a semiconductor memory apparatus, a block decoder therefor, and a decoding method thereof.

2. Related Art

According to the recent trend, a voltage level supplied from outside the semiconductor apparatus has gradually decreased to lower power consumption of a semiconductor apparatus. In some cases, however, the semiconductor apparatus may internally require a voltage having a higher level than the external voltage. Thus, at this time, the semiconductor apparatus uses a voltage pumping circuit.

In particular, a flash memory apparatus requires a voltage of 20V or more, depending on the operation mode thereof. That is, during a program, read, or erase operation of the flash memory apparatus, a high voltage must be supplied to a word line of a memory cell. This operation is performed by a block decoder.

For example, FIG. 1 is a configuration diagram of a conventional semiconductor memory apparatus, illustrating a flash memory apparatus.

Referring to FIG. 1, the semiconductor memory apparatus 100 includes a memory area 101 (including a common source line CSL), a page buffer circuit 103, a block switch 105, a word line decoder 107, and a plurality of block decoders 109-0 to 109-K.

The memory area 101 may be divided into a plurality of blocks 101-0 to 101-K, and each of the blocks has a string structure in which a plurality of memory cells are connected between word lines WL (i.e., WLn, WLn−1, WL0) and bit lines BL (i.e., BLe and BLo). That is, a plurality of memory cells are connected in series to a drain select switch driven by a voltage applied to a drain select line DSL, thereby forming one string, and the final cell of the string is connected to a source select switch driven by a voltage applied to a source select line SSL. Furthermore, a plurality of memory cells connected to one word line WL form one page.

The page buffer circuit 103 is connected to the bit lines extended from the memory area 101, and are configured to transmit and receive data to an input/output control logic (not illustrated). The word line decoder 107 is configured to decode a row address for accessing the memory area 101.

The block decoders 109-0 to 109-K are provided for the respective blocks 109-0 to 109-K, and are configured to apply block select signals to word lines BLKWL0 to BLKWLK, respectively, to control the block switches 105-0 to 105-K.

The block switches 105-0 to 105-K are configured to apply a voltage signal generated by a high voltage generator (not illustrated) to the memory cell blocks 101-0 to 101-K according to the output levels of the block decoders 109-0 to 109-K. For this operation, the block switches 105-0 to 105-K include switches for connecting global word lines GWL (i.e., GWLn, GWLn−1, GWL0) to the memory cell blocks 101-0 to 101-K and include switches for connecting a global drain select line GDSL and a global source select line GSSL to the memory cell blocks 101-0 to 101-K.

The high voltage generator (not illustrated) includes one or more pumps to provide a high voltage according to each operation mode of the semiconductor memory apparatus. Furthermore, the high voltage generated by the high voltage generator is provided to the block switches 105-0 to 105-K through the word line decoder 107. As the block switches 105-0 to 105-K are turned on by the block decoders 109-0 to 109-K, the high voltage is applied to a selected block of the memory area 101.

FIG. 2 is a configuration diagram of the conventional block decoder.

The block decoder 109 illustrated in FIG. 2 includes a block address decoding unit P1 and N1 to N5 configured to output a control signal to a node A in response to an enable signal EN and block address signals XA, XB, XC, and XD.

Furthermore, the block decoder 109 includes a high voltage transmission unit having first and second high voltage switches DHVN and HVP, respectively, connected in series between a high voltage supply terminal VBLC and block word line connection nodes B, respectively, and the second high voltage switch HVP is driven according to a voltage level applied to the node A.

In addition, the block decoder 109 includes select line control circuits P2, N6, and N7 configured to control the voltages of the drain select line DSL and the source select line SSL according to the voltage level of the node A.

The block decoder 109 illustrated in FIG. 2 is provided for each of the blocks 101-0 to 101-K forming the memory area 101 as illustrated in FIG. 1. Accordingly, since the block decoder 109 occupies a large area, the size of the block decoder 109 must be reduced if a high integration of a semiconductor memory apparatus is desired.

Furthermore, the block decoder 109 may include the first and second high voltage switches DHVN and HVP, respectively, to supply the high voltage VBLC to the block word line BLKWL. The high voltage switches DHVN and HVP are designed with a large size for switching high voltages. Therefore, due to the size of the high voltage switches DHVN and HVP, the size of the block decoder 109 may increase.

In particular, the high voltage switch DHVN is designed as a depletion type such that a threshold voltage has a negative (−) value at all times. Accordingly, compared to a general NMOS transistor or high-voltage NMOS transistor HVN, the high voltage switch DHVN is fabricated to have a relatively larger size.

As the high voltage switches, having a large size, are employed and having the block decoder provide for each of the memory blocks, the block decoder 109 may then serve as an obstacle to reducing the size of the semiconductor memory apparatus.

Furthermore, the body of the high voltage switch HVP is connected to a source terminal configured to receive the high voltage VBLC. Therefore, when the high voltage VBLC (for example, 28~31V) is applied to the source terminal and the body is in a state in which a gate terminal of the high voltage switch HVP is set to 0V, a failure may occur in a gate oxide layer of the high voltage switch HVP. When the high voltage switch HVP is not turned on due to the failure of the gate oxide layer, a high voltage cannot be supplied to the block word line BLKWL, and thus, the circuit may malfunction.

SUMMARY

In an embodiment, a block decoder includes: a first selection unit configured to receive a block address signal and output a block select signal to any one of a plurality of blocks; and a second selection unit configured to receive a high voltage and control a potential level of the block select signal according to the block address signal.

In another embodiment, a block decoder includes: a first selection unit configured to output a block select signal to select any one of a plurality of blocks in response to a block address signal; an amplification unit configured to amplify the block address signal and generate a high voltage block address signal; and a second selection unit configured to control a potential level of the block select signal in response to the high voltage block address signal.

In another embodiment, a semiconductor memory apparatus includes: a memory area including a plurality of memory blocks; and a block decoder configured to select any one of the plurality of memory blocks and apply a high voltage, wherein the block decoder includes: a first selection unit configured to select any one of the plurality of memory blocks according to a block address signal and output a memory block select signal to any one of the plurality of memory blocks; and a second selection unit configured to receive a high voltage and control a potential level of the memory block select signal according to the block address signal.

In another embodiment, a semiconductor memory apparatus includes: a memory area including one or more memory blocks; a word line decoder configured to decode a row address for accessing the memory area; a block switch connected between the word line decoder and the memory area, configured to connect a global line to the memory area, and including a word line switch, a drain select switch, and a source select switch; a first selection unit configured to control the word line switch by generating a first control signal for selecting any one of the memory blocks in response to a block address signal, and control the drain select switch and the source select switch; and a second selection unit configured to output a second control signal for controlling a potential level of the first control signal in response to a high voltage block address signal generated from the block address signal.

In another embodiment, a decoding method of a semiconductor memory apparatus includes the steps of: selecting any one of a plurality of memory blocks in response to a block address signal; amplifying the block address signal; and transmitting a high voltage to a selected memory block in response to an amplified block address signal.

BRIEF DESCRIPTION OF THE DRAWINGS

Features, aspects, and embodiments are described in conjunction with the attached drawings, in which.

DETAILED DESCRIPTION

Hereinafter, a semiconductor memory apparatus, a block decoder therefor, and a decoding method thereof will be described below with reference to the accompanying drawings through various embodiments.

Figure 3:
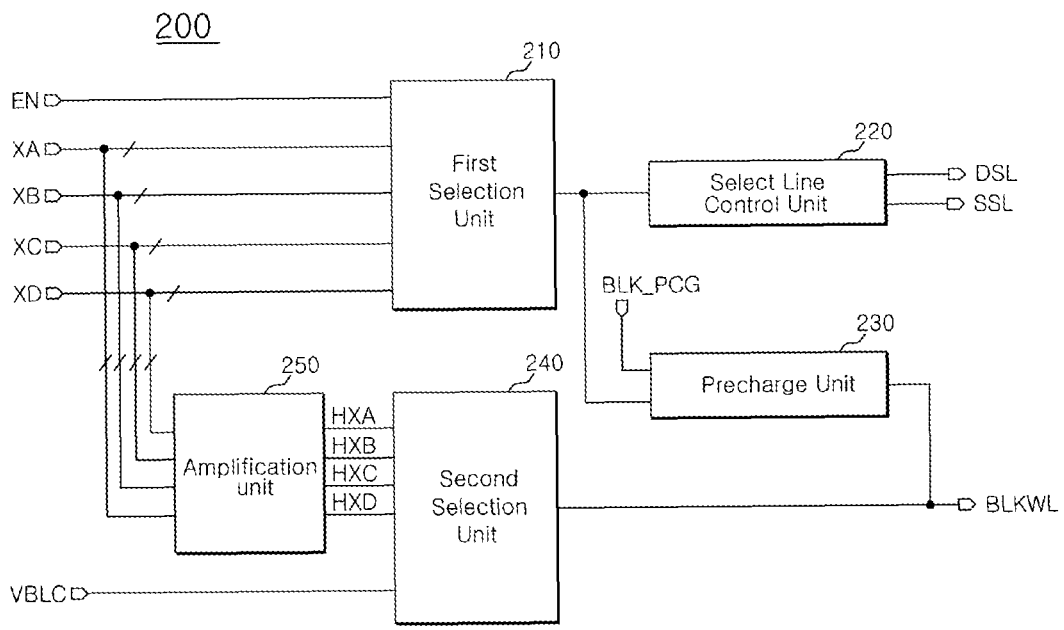
FIG. 3 is a configuration diagram of a block decoder according to an embodiment of the present invention.

FIG. 3 is a configuration diagram of a block decoder according to an embodiment.

Referring to FIG. 3, the block decoder 200 according to an embodiment may include a first selection unit 210, a select line control unit 220, a precharge unit 230, a second selection unit 240, and an amplification unit 250.

The first selection unit 210 may be configured to be driven according to an enable signal EN and generate a block select signal BLKWL for selecting a block corresponding to block address signals XA, XB, XC, and XD among a plurality of memory blocks.

The second selection unit 240 may be connected to a high voltage supply terminal VBLC. The second selection unit 240 may be configured to be driven according to signals obtained by amplifying the block address signals XA, XB, XC, and XD and may control the potential of the block select signal BLKWL. The block address signals XA, XB, XC, and XD may be amplified by the amplification unit 250 and may be output by the amplification unit as high voltage block address signals HXA, HXB, HXC, and HXD.

In an embodiment, the first selection unit 210 may be connected to each of the memory blocks, and the second selection unit 220 may be shared by all of the memory blocks.

Meanwhile, the select line control unit 220 may be configured to control the potentials of a drain select line DSL and a source select line SSL in response to the block select signal BLKWL outputted from the first selection unit 210.

Furthermore, the precharge unit 230 may be configured to reset the block select signal BLKWL to a precharge voltage level in response to the block precharge signal BLK_PCG.

The respective units will be described below as follows.

Figure 4:
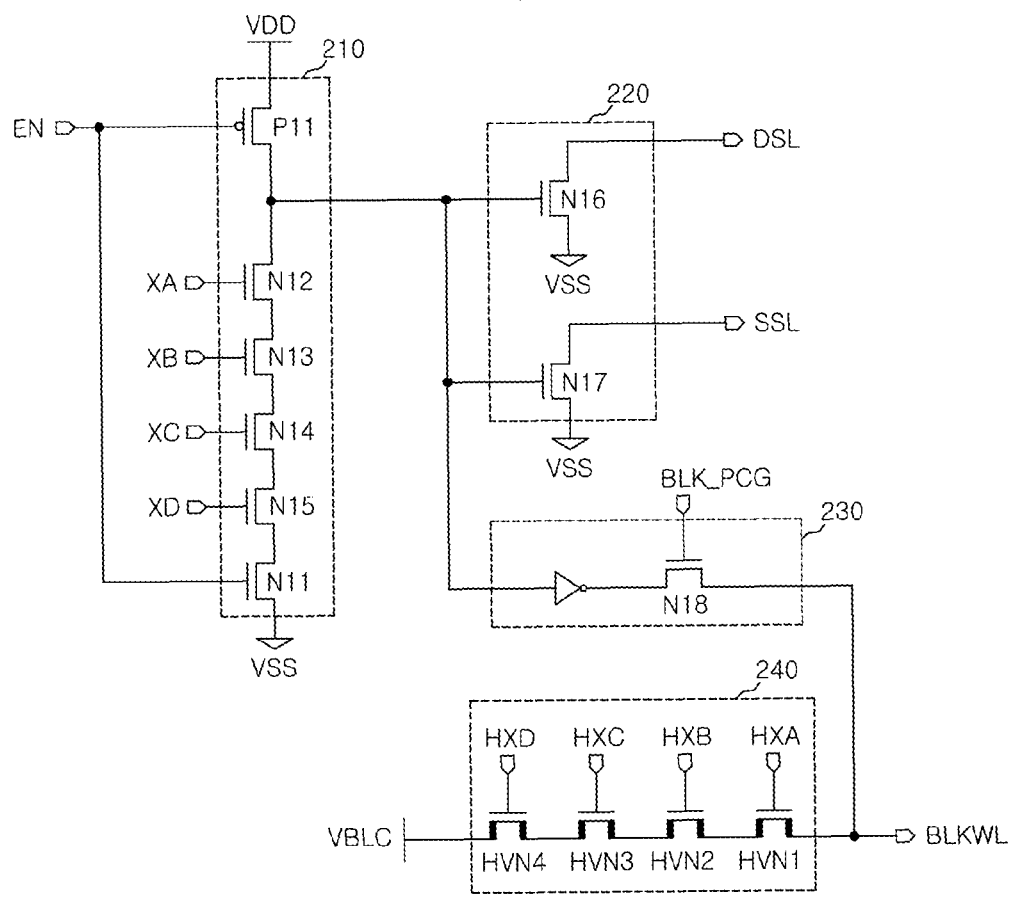
FIG. 4 is a circuit diagram of the block decoder illustrated in FIG. 3.

FIG. 4 is a circuit diagram of the block decoder illustrated in FIG. 3.

Referring to FIG. 4, the first selection unit 210 may include first to sixth switching elements P11, N12, N13, N14, N15, and N11, respectively, which may be connected in series between a power supply voltage terminal VDD and a ground voltage terminal VSS. The first and sixth switching elements P11 and N11 may be driven in response to the enable signal EN. Furthermore, the second to fifth switching elements N12 to N15 may be configured to generate the block select signal BLKWL for selecting any one of the memory blocks in response to the block address signals XA, XB, XC, and XD.

Here, the first block address signal XA may be a signal for dividing the memory blocks into a plurality of first sub block groups, and the second block address signal XB may be a signal for dividing the first sub block group into a plurality of second sub block groups. Furthermore, the third block address signal XC may be a signal for dividing the second sub block group into a plurality of third sub block groups, and the fourth block address signal XD may be a signal for dividing the third block group into a plurality of fourth sub block groups.

Also, the first selection unit 210 may have an output terminal connected to the select line control unit 220. Referring to FIG. 4, the select line control unit 220 may include a switching element N16 and a switching element N17. The switching element N16 may be configured to control the potential of a drain select line DSL of the memory block in response to a signal applied to the output terminal of the first selection unit 210, that is, the block select signal BLKWL. Additionally, the switching element N17 may be configured to control the voltage of a source select signal SSL of the memory block in response to the block select signal BLKWL.

Furthermore, the precharge unit 230 may include a switching element N18 which may be configured to reset the level of the block select signal BLKWL to the precharge voltage level in response to the block precharge signal BLK_PCG.

In an embodiment, the second selection unit 240 is used in all the memory blocks in common, and may include first to fourth high voltage switching elements HVN1 to HVN4. More specifically, the fourth to first high voltage switching elements HVN4 to HVN1 of the second selection unit 240 may be connected in series between the high voltage supply terminal VBLC and the block select signal output terminal BLKWL. The fourth to first high voltage switching elements HVN4 to HVN1 of the second selection unit 240 may be driven in response to high voltage block address signals HXD, HXC, HXB, and HXA, respectively. Here, the high voltage block address signals HXD, HXC, HXB, and HXA may be generated from the block address signals XD, XC, XB, and XA. For example, the amplification unit 250 (see FIG. 3) may delay or amplify the block address signals XD, XC, XB, and XA by a predetermined time to generate the high voltage block address signals HXD, HXC, HXB, and HXA, but the generation of the high voltage block address signals HXD, HXC, HXB, and HXA is not limited thereto.

In the block decoder illustrated in FIG. 4, the first selection unit 210 may select any one of the memory blocks in response to the block address signals XD, XC, XB, and XA. Furthermore, whether or not to turn on/off the high voltage switching elements HVN1 to HVN4 of the second selection unit 240 may be determined by the high voltage block address signals HXD, HXC, HXB, and HXA generated from the block address signals XD, XC, XB, and XA. Additionally, the high voltage VBLC may be provided to a block switch of the memory block selected by the block address signals XD, XC, XB, and XA.

In an embodiment, the high voltage switching elements HVN1 to HVN4 may be configured with general high voltage NMOS transistors, without using depletion-type NMOS transistors. Therefore, compared with depletion-type NMOS transistors, that is, when high voltage switches DHVN are employed, it is possible to reduce an area occupied by the high voltage switching elements HVN1 to HVN4.

Furthermore, the block decoder illustrated in FIG. 4 may supply a high voltage VBLC to the memory block without using a P-type high voltage switch HVP. When the P-type high voltage switch HVP receives 0V and the high voltage VBLC through gate and source terminals thereof, respectively, the high voltage may also be applied to a body connected to the source terminal, thereby destroying a gate oxide layer. In an embodiment, however, since the high voltage may be supplied to the N-type high voltage switches HVN, it is possible to not only reduce an area occupied by the block decoder, but also exclude the possibility of failure occurrences in the high voltage switches.

Figure 5:
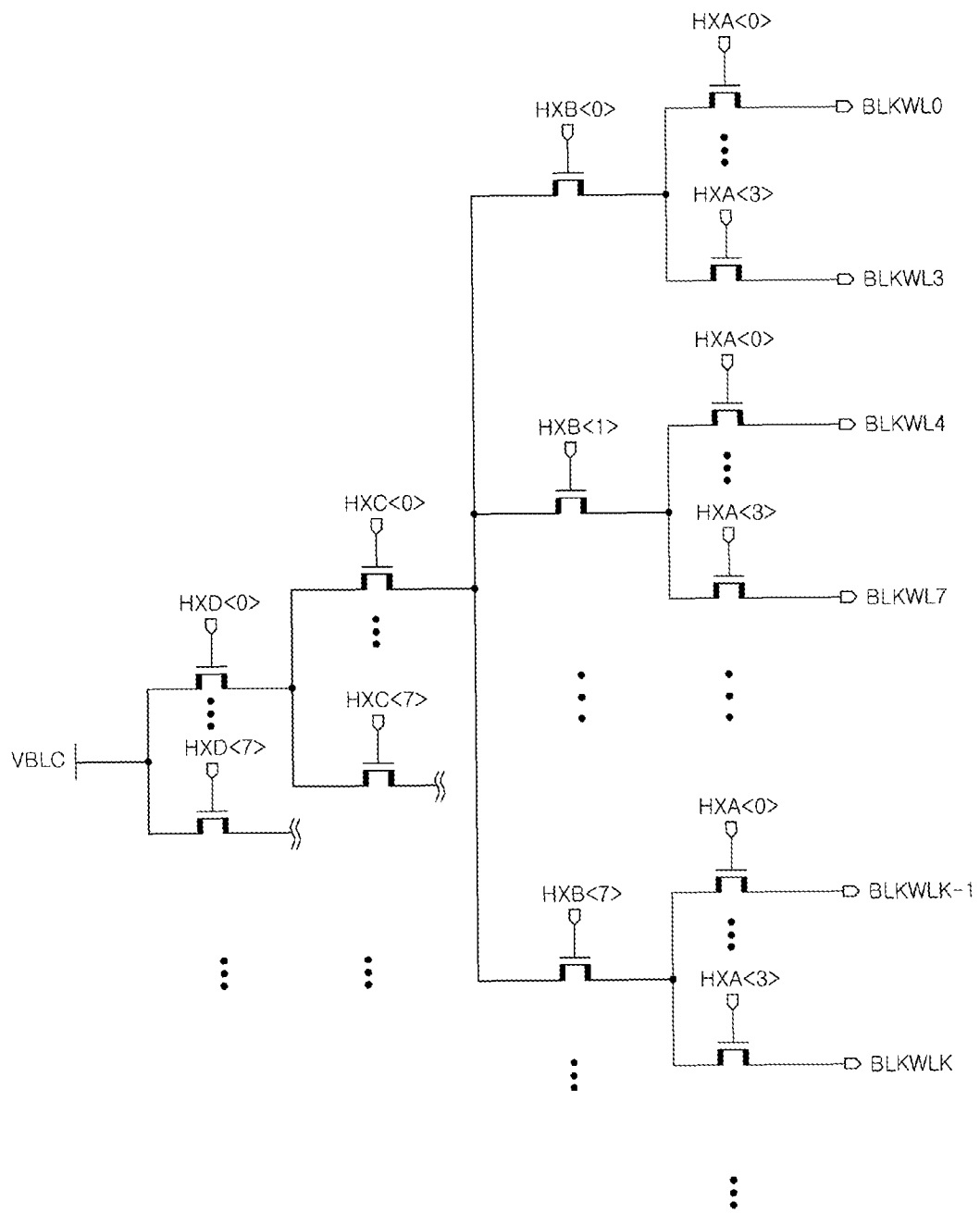
FIG. 5 is a diagram illustrating the configuration of a second selection unit illustrated in FIG. 3.

FIG. 5 is a diagram illustrating the configuration of the second selection unit illustrated in FIG. 3.

In the above-described block decoder according to an embodiment, the second selection unit may be configured to be shared by all memory blocks. FIG. 5 illustrates the example.

Block switches used for selecting any one of a plurality (K+1) of memory blocks may be driven in response to block select signals BLKWL0 to BLKWLK.

In order to efficiently designate an address, the block address signals XA, XB, XC, and XD may be managed as a plurality of first block addresses XA for dividing a plurality of first sub blocks, that is, unit memory blocks, a plurality of second block addresses XB for dividing the first sub block into a plurality of second sub blocks, a plurality of third block addresses XC for dividing the second sub block into a plurality of third sub blocks, and a plurality of fourth block addresses XD for dividing the third sub block into a plurality of fourth sub blocks.

As described above, the high voltage block address signals HXA, HXB, HXC, and HXD may be generated from the block address signals XA, XB, XC, and XD. As known from FIG. 5, any one of the fourth sub blocks may be selected by the fourth high voltage block address signal HXD (i.e., HXD<0> to HXD<7>), and any one of the third sub blocks corresponding to a sub group of the selected fourth sub block may be selected by the third high voltage block address signal HXC (i.e., HXC<0> to HXC<7>). Similarly, any one of the second sub blocks corresponding to a sub group of the selected third sub block may be selected by the second high voltage block address signal HXB (i.e., HXB<0> to HXB<7>), and any one of the first sub blocks corresponding to a sub group of the selected second sub block may be selected by the fourth high voltage block address signal HXA (i.e., HXA<0> to HXA<3>).

In order to access a specific block of the memory area, the block address signals XA, XB, XC, and XD may be decoded. Furthermore, the high voltage VBLC may be supplied only to any one of the block select signals BLKWL0 to BLKWLK by the high voltage block address signals HXA, HXB, HXC, and HXD generated from the block address signals XA, XB, XC, and XD.

Therefore, the first selection unit 210 may be connected to correspond to each of the memory blocks, and may select any one of the plurality of memory blocks in response to the block address signals XA, XB, XC, and XD. The second selection unit 240 may be connected in such a way so as to be shared by all the memory blocks, and may be selectively driven by any one of the plurality of block switches in response to the block address signals XA, XB, XC, and XD.

Figure 6:
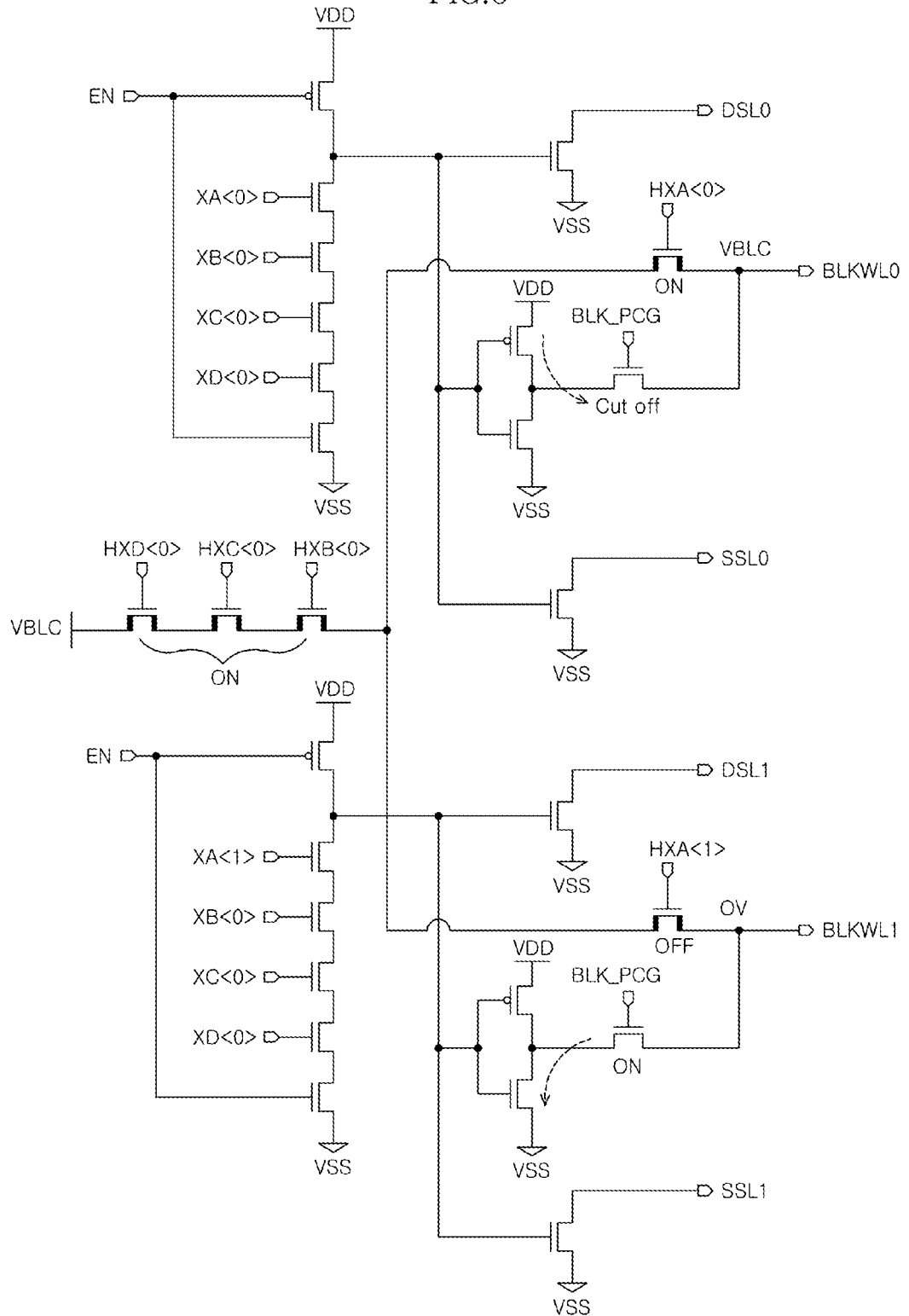
FIG. 6 is a diagram illustrating the operation of the block decoder according to an embodiment during a program or read mode.

FIG. 6 is a diagram illustrating the operation of the block decoder during a program or read mode according to an embodiment.

For convenience of description, suppose that a memory block (block 0) driven by the block select signal BLKWL0 is selected to perform a program or read operation.

As block address signals XA<0>, XB<0>, XC<0>, and XD<0> for selecting the block 0 are applied at high voltage levels, an output node of a first decoder may become a low voltage level. Accordingly, the potentials of a drain select line DSL0 and a source select line SSL0 may constantly be maintained.

Additionally, as high voltage block address signals HXA<0>, HXB<0>, HXC<0>, and HXD<0> generated from the block address signals XA<0>, XB<0>, XC<0>, and XD<0> also become a high voltage level, the block select signal BLKWL0 may have a high voltage level VBLC. Also, since an inverter connected to an output terminal of the first decoder is turned on and the level of the block precharge signal BLK_PCG may be about 2.3V, a transistor driven by the block precharge signal BLK_PCG may be cut off. As a result, the block select signal BLKWL0 has a high voltage level VBLC.

Additionally, as a first block address signal XA<1> of block address signals XA<1>, XB<0>, XC<0>, and XD<0> for selecting a block 1 becomes a low voltage level, the output node of the first decoder becomes a high voltage level. Accordingly, a drain select line DSL1 and a source select line SSL1 have a ground voltage level, and are set in an unselected state.

Also, although the high voltage block address signals HXB<0>, HXC<0>, and HXD<0> become a high level, the first high voltage block address signal HXA<1> generated from the first block address signal XA<1> has a low voltage level. Therefore, since the high voltage VBLC cannot be applied as a block select signal BLKWL1, the block select signal BLKWK1 is set to 0V.

Additionally, an inverter connected to the output terminal of the first decoder is turned off, but an NMOS transistor forming the inverter is turned on. Therefore, a transistor driven by the block precharge signal BLK_PCG is turned on, and the block select signal BLKWL0 maintains the ground voltage of 0V.

Figure 7:
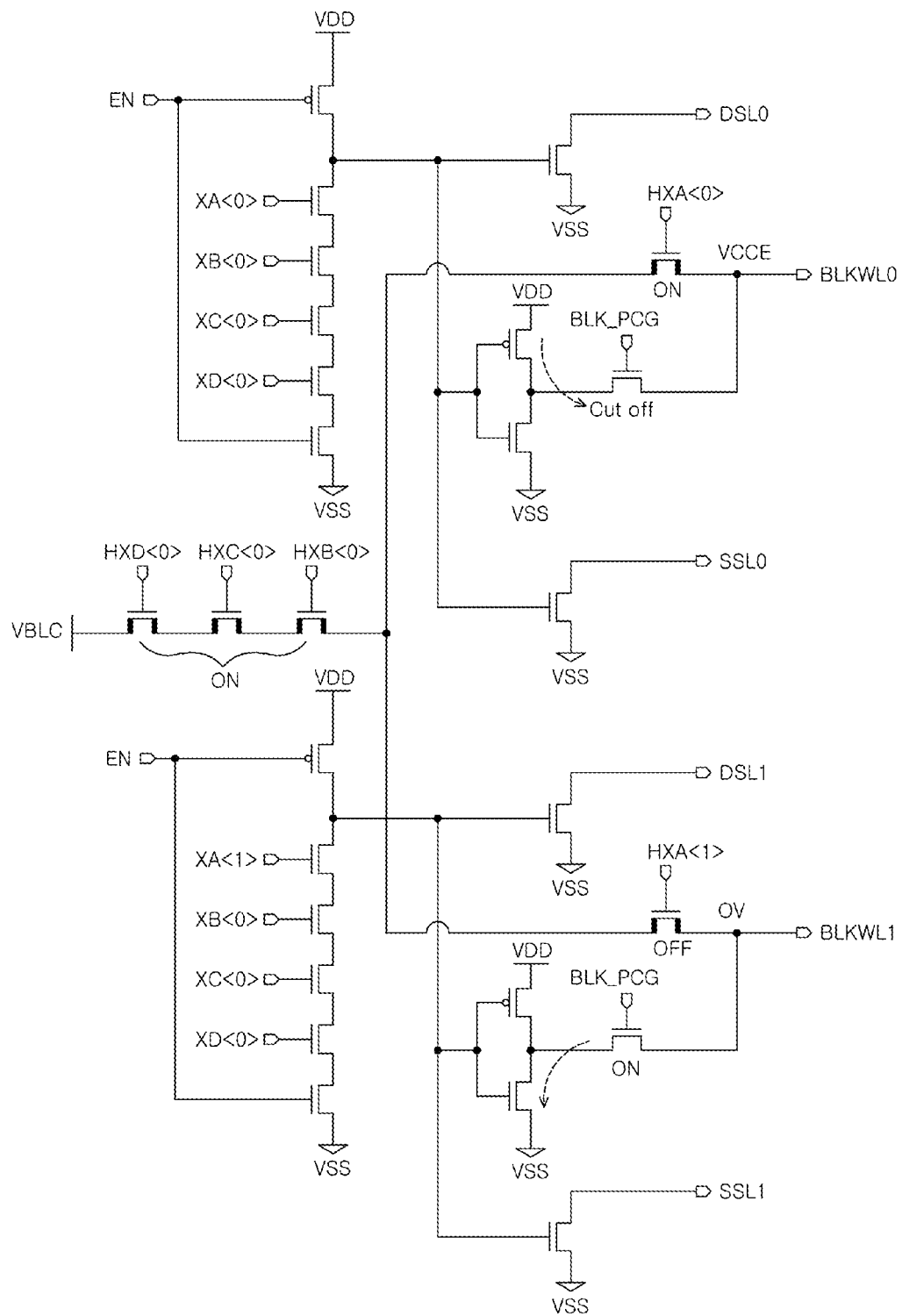
FIG. 7 is a diagram illustrating the operation of the block decoder according to an embodiment, during an erase mode.

FIG. 7 is a diagram illustrating the operation of the block decoder according to an embodiment, during an erase mode.

Similarly as described with reference to FIG. 6, the block address signals XA<0>, XB<0>, XC<0>, and XD<0> and the high voltage block address signals HXA<0>, HXB<0>, HXC<0>, and HXD<0> generated from the block address signals XA<0>, XB<0>, XC<0>, and XD<0> become a high voltage level, and the block select signal BLKWL0 may become an erase voltage level VCCE.

Furthermore, when the first block address signal XA<1> and the first high voltage block address signal HXA<1> generated from the first block address signal XA<1> become a low voltage level, a high voltage may not be applied as the block select signal BLKWL1, and the block select signal BLKWL1 may maintain 0Vs.

Figure 1:
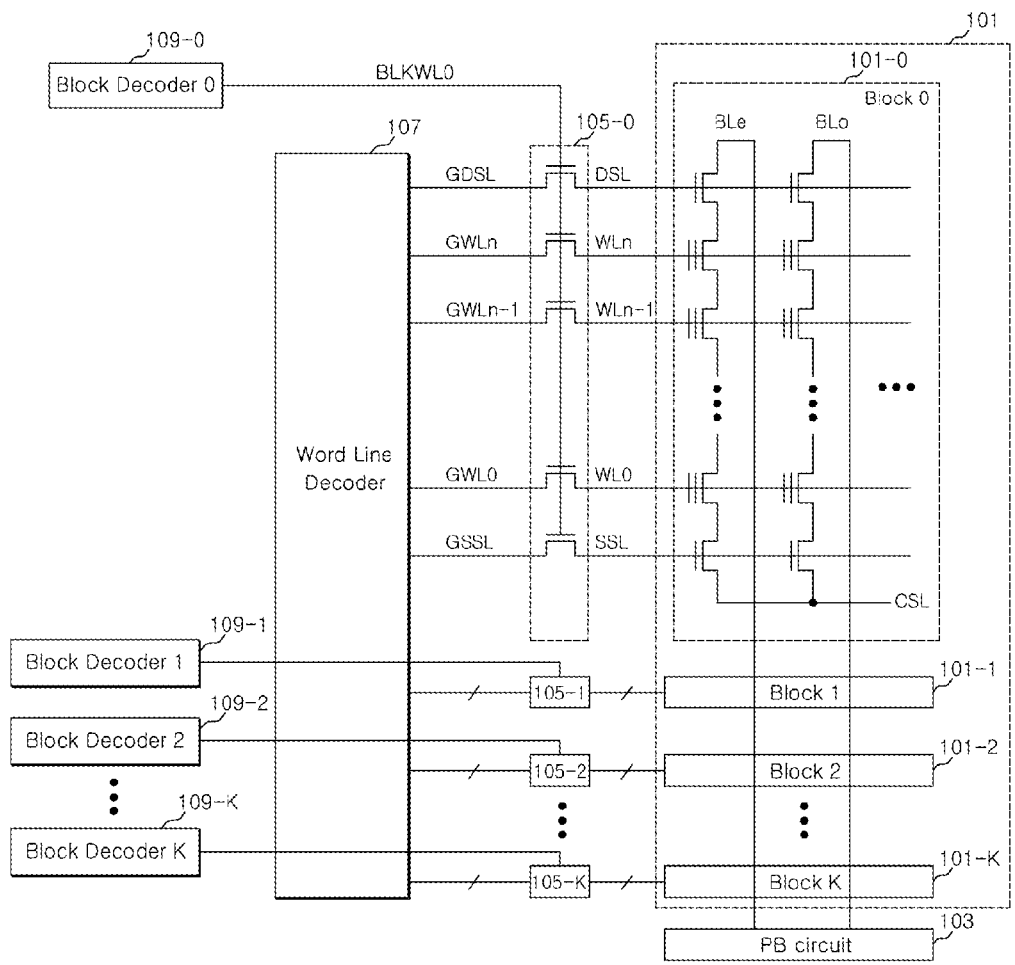
FIG. 1 is a configuration diagram of a conventional semiconductor memory apparatus.
Figure 2:
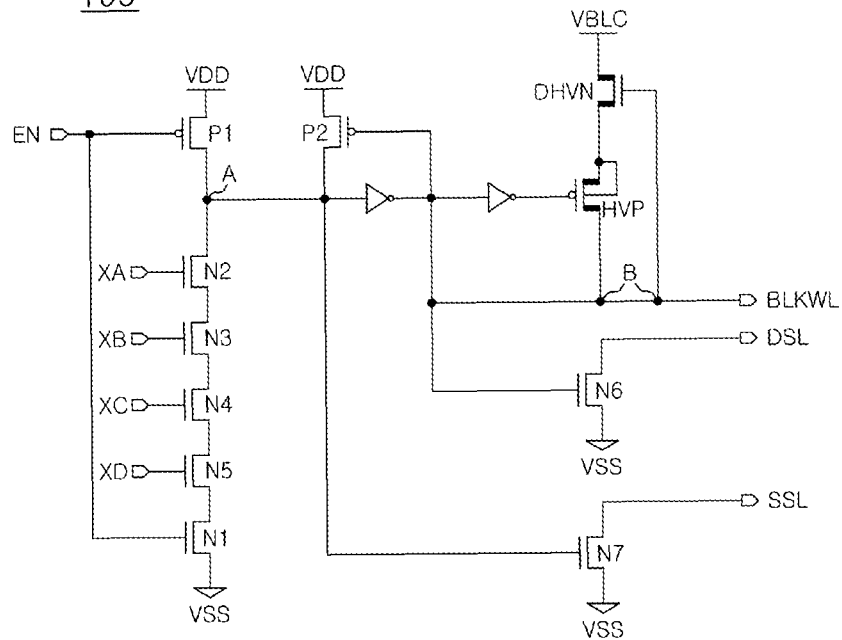
FIG. 2 is a configuration diagram of a conventional block decoder.

In an embodiment, each of the high voltage switches HVN for transferring the high voltage may have a size as small as 0.008 mm$^2$. Therefore, in comparison to when the block decoder illustrated in FIG. 2 is applied, it is possible to reduce the area of the block decoder by 40~60%.

TABLE 1

| | Block decoder size | Reduction rate |
|---|---|---|
| K2 32Gb MLC | 120 μm (general block decoder)<br>53 μm (decoder of present invention) | −45.8% |
| EV 64Gb MCL(A) | 130 μm (general block decoder)<br>60 μm (decoder of present invention) | −53.58% |

As known from Table 1, when memory apparatuses having the same capacity are fabricated, it is possible to reduce an area occupied by the block decoder by ½ or more in cases where the decoder according to an embodiment is applied.

Furthermore, when the above-described block decoder is used to decode a block address of a memory apparatus, any one of a plurality of memory blocks may be selected in response to a block address signal, and a high voltage may be provided to the selected memory block in response to the block address signal, in order to perform decoding.

Figure 8:
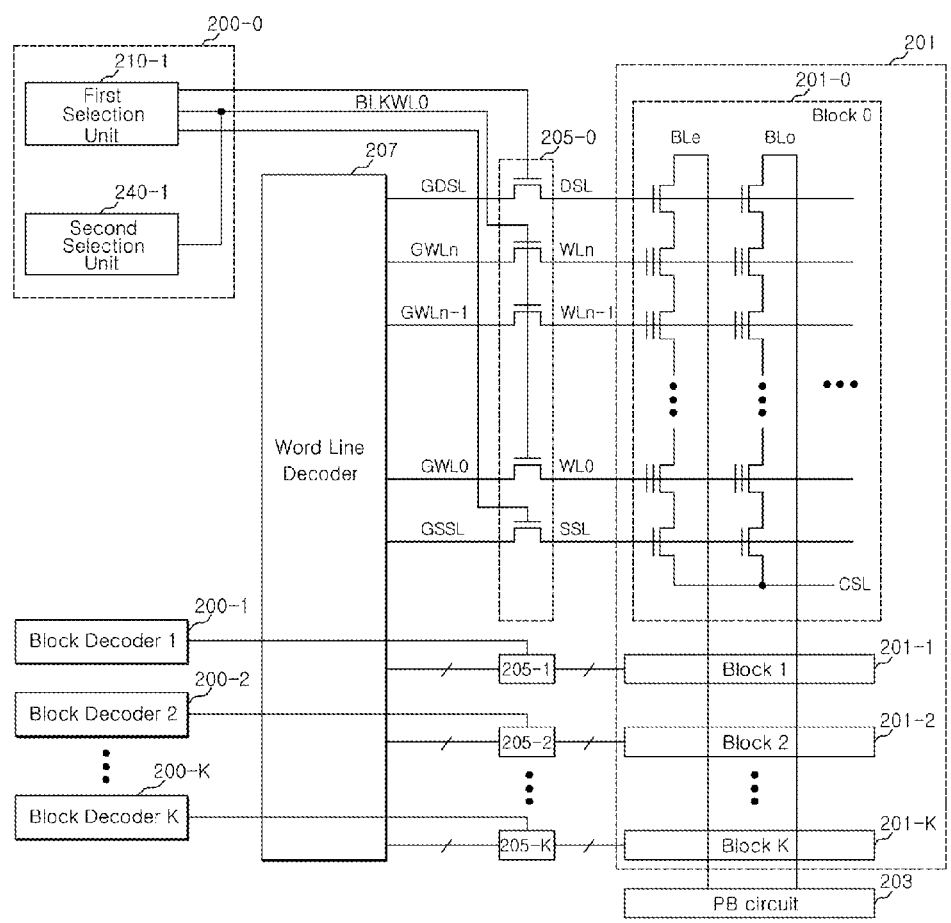
FIG. 8 is a configuration diagram of a semiconductor memory apparatus according to another embodiment.

FIG. 8 is a configuration diagram of a semiconductor memory apparatus according to another embodiment.

Referring to FIG. 8, the semiconductor memory apparatus 20 may include a memory area 201, a page buffer circuit 203, a block switch 205 (i.e., 205-0 to 205-K), a word line decoder 207, and a plurality of block decoders 200-0 to 200-K.

The memory area 201 may be divided into a plurality of blocks 201-0 to 201-K, and each of the memory blocks has a string structure in which a plurality of memory cells included therein may be connected between word lines WL (i.e., WLn, WLn−1, WL0) and bit lines BL (i.e., BLe and BLo). That is, a plurality of memory cells may be connected in series to a drain select switch driven by a voltage applied to a drain select line DSL, thereby forming one string, and the final cell of the string may be connected to a source select switch driven by a voltage applied to a source select line SSL. Furthermore, a plurality of memory cells may be connected to one word line WL form one page.

The page buffer circuit 203 may be connected to the bit lines extended from the memory area 201 and configured to transmit and receive data to and from an input/output control logic (not illustrated), and the word line decoder 207 may be configured to decode a row address for accessing the memory area 201.

The block decoders 200-0 to 200-K may be configured to apply block select signals to block word lines BLKWL0 to BLKWLK (not illustrated), respectively, to control the block switches 205-0 to 205-K.

The block switches 205-0 to 205-K may be configured to apply a voltage signal generated by a high voltage generator (not illustrated) to the memory cell blocks 201-0 to 201-K according to the output levels of the block decoders 200-0 to 200-K. For this operation, the block switches 205-0 to 205-K may include word line connection switches for connecting global word lines GWL (i.e., GWLn, GWLn−1, GWL0) to the memory cell blocks 201-0 to 201-K and a drain connection switch and a source connection switch for connecting a global drain select line GDSL and a global source select line GSSL to the memory cell blocks 201-0 to 201-K.

The high voltage generation unit (not illustrated) may include one or more pumps to provide a high voltage for each operation mode of the semiconductor memory apparatus. Furthermore, the high voltage generated by the high voltage generator may be provided to the block switches 205-0 to 205-K through the word line decoder 207. As the block switches 205-0 to 205-K are turned on by the block decoders 200-0 to 200-K, the high voltage may be applied to a selected block of the memory area 201.

The block decoders 200-0 to 200-K will be described in more detail.

In an embodiment, each of the block decoders 200-0 to 200-K may include a first selection unit 210-1 and a second selection unit 240-1. Furthermore, the first selection unit 210-1 may be provided for each memory block, and the second selection unit 240-1 may be shared by all memory blocks.

The first selection unit 210-1 may generate a first control signal BLKWL for selecting a corresponding block in response to block address signals XA, XB, XC, and XD, and drive a block switch for driving a drain select switch and a block switch for driving a source select switch. Accordingly, the word line WL of the selected memory block may be connected to the global word line GWL, and the drain select line. Additionally, the source select line of the selected memory block may be connected to the global drain select line GDSL and the global source select line GSSL.

In an embodiment, the first selection unit 210-1 may be configured to include the first selection unit 210, the select line control unit 220, and the precharge unit 230, which are illustrated in FIGS. 3 and 4, but is not limited thereto.

The second selection unit 240-1 may be connected to a high voltage supply terminal VBLC, and configured to be driven according to signals obtained by amplifying the block address signals XA, XB, XC, and XD and control the potential level of the block select signal BLKWL. Furthermore, the second selection section 240-1 may be configured substantially like the second selection unit 240 as illustrated in FIGS. 3 to 5.

When the second selection unit 240-1 is configured as illustrated in FIG. 4, the high voltage VBLC may be supplied to a memory block without using a P-type high voltage switch HVP. Therefore, it is possible to not only reduce an area occupied by the block decoder, but to also exclude the possibility of failure occurrence in the high voltage switches.

While certain embodiments have been described above, it will be understood to those skilled in the art that the embodiments described are by way of example only. Accordingly, the semiconductor memory apparatus described herein should not be limited based on the described embodiments.

What is claimed is:

1. A block decoder comprising:
   a first selection unit configured to couple to each of a plurality of memory blocks, receive a plurality of block address signals and output a block select signal corresponding to the plurality of block address signals; and
   a second selection unit configured to be connected to the plurality of memory blocks in common, receive a high voltage, driven by all of a plurality of high voltage block address signals generated from each of the plurality of block address signals, and control a potential level of the block select signal according to all of the plurality of high voltage block address signals.

2. The block decoder according to claim 1, further comprising a select line control unit operably coupled to an output terminal of the first selection unit and configured to control an output voltage of a block switch driven by the block select signal.

3. The block decoder according to claim 1, further comprising a precharge unit operably coupled to an output terminal of the first selection unit and configured to control the potential level of the block select signal according to a block precharge signal.

4. A block decoder comprising:
   a first selection unit configured to couple to each of a plurality of memory blocks, output a block select signal corresponding to a plurality of block address signals;
   an amplification unit configured to amplify each of the plurality of block address signals and generate a plurality of high voltage block address signals; and
   a second selection unit configured to be connected to the plurality of memory blocks in common and control a potential level of the block select signal in response to the all of the plurality of high voltage block address signals.

5. The block decoder according to claim 4, further comprising a select line control unit operably coupled to an output terminal of the first selection unit and configured to control an output voltage of a block switch driven by the block select signal.

6. The block decoder according to claim 4, further comprising a precharge unit operably coupled to an output terminal of the first selection unit and configured to control the potential level of the block select signal according to a block precharge signal.

7. A semiconductor memory apparatus comprising:
   a memory area comprising a plurality of memory blocks; and
   a block decoder configured to select any one of the plurality of memory blocks and apply a high voltage,
   wherein the block decoder comprises:
   a first selection unit configured to couple to each of the plurality of memory blocks and output a memory block select signal corresponding to a plurality of block address signals; and
   a second selection unit configured to be connected to the plurality of memory blocks in common, receive a high voltage, driven by all of a plurality of high voltage block address signals generated from each of the plurality of block address signals, and control a potential level of the memory block select signal according to all of the plurality of high voltage block address signals.

8. The semiconductor memory apparatus according to claim 7, further comprising a select line control unit operably coupled to an output terminal of the first selection unit and configured to control an output voltage of a block switch driven by the memory block select signal.

9. The semiconductor memory apparatus according to claim 7, further comprising a precharge unit operably coupled to an output terminal of the first selection unit and configured to control the potential level of the memory block select signal according to a block precharge signal.

10. A semiconductor memory apparatus comprising:
    a memory area comprising one or more memory blocks;
    a word line decoder configured to decode a row address for accessing the memory area;
    a block switch connected between the word line decoder and the memory area, configured to connect a global line to the memory area, and comprising a word line switch, a drain select switch, and a source select switch;
    a first selection unit configured to couple to each of the plurality of memory blocks, control the word line switch by generating a first control signal corresponding to a plurality of block address signals, and control the drain select switch and the source select switch; and
    a second selection unit configured to be connected to the plurality of memory blocks in common, output a second control signal for controlling a potential level of the first control signal in response to all of a plurality of high voltage block address signals generated from each the plurality of block address signals.

11. A decoding method of a semiconductor memory apparatus including a first selection unit coupled to each of a plurality of memory blocks, an amplification unit and a second selection unit connected to the plurality of memory blocks in common, comprising the steps of:
    generating a block select signal by the first selection unit in response to a plurality of block address signals;
    amplifying each the plurality of block address signals by the amplification unit to generate a plurality of high voltage block address signals; and
    control a potential level provided to a selected memory block by the second selection unit in response to all of the plurality of high voltage block address signals.

12. The decoding method according to claim 11, wherein the step of control a potential level provided to the selected memory block comprises the step of controlling a potential level of the block select signal.

* * * * *